United States Patent [19]

Alley

[11] Patent Number: 4,823,075
[45] Date of Patent: Apr. 18, 1989

[54] CURRENT SENSOR USING HALL-EFFECT DEVICE WITH FEEDBACK

[75] Inventor: Robert P. Alley, Clifton Park, N.Y.

[73] Assignee: General Electric Company, Schenectady, N.Y.

[21] Appl. No.: 107,328

[22] Filed: Oct. 13, 1987

[51] Int. Cl.⁴ .................. G01R 19/32; G01R 21/08
[52] U.S. Cl. .................... 324/117 H; 324/117 R; 324/251; 324/99 R; 338/32 H
[58] Field of Search ............... 307/309; 338/32 H; 324/117 R, 117 H, 99 D, 99 R, 127, 251; 357/27; 323/368

[56] References Cited

U.S. PATENT DOCUMENTS

| | | | |
|---|---|---|---|
| 3,422,351 | 1/1969 | Pihl | 324/99 R |
| 4,020,294 | 4/1977 | Kitajewski et al. | 324/117 H |
| 4,296,410 | 10/1981 | Higgs et al. | 338/32 H |
| 4,449,081 | 5/1984 | Doemen | 324/117 H |
| 4,616,188 | 10/1986 | Stitt et al. | 324/117 H |
| 4,682,101 | 7/1987 | Cattaneo | 324/117 H |
| 4,687,994 | 8/1987 | Fulkerson et al. | 324/251 |

FOREIGN PATENT DOCUMENTS 0154264  9/1983  Japan ................. 338/32 H

OTHER PUBLICATIONS

"Hall Effect Current-Sense Module", by Arnold et al., IBM Tech. Disc. Bull., vol. 17, #11, pp. 3218–3219, 4/75.

*Primary Examiner*—Reinhard J. Eisenzopf
*Assistant Examiner*—W. Burns
*Attorney, Agent, or Firm*—Geoffrey H. Krauss; James C. Davis, Jr.; Marvin Snyder

[57] ABSTRACT

A current sensor for use with a conductor with known cross-sectional characteristics is an electronic circuit having a monolithic Hall-effect element disposed substantially perpendicular to the conductor first major surface. A conductive loop substantially encircles the element and is oriented such that its flux is substantially orthogonal to the element surface. An amplifier sets current flow in the loop responsive to minimization of the differential Hall voltage across element. The loop current, at null, will be related to the conductor current by the ratio of the conductor flux path length to the loop flux path length.

15 Claims, 2 Drawing Sheets

//4,823,075//

CURRENT SENSOR USING HALL-EFFECT DEVICE WITH FEEDBACK

BACKGROUND OF THE INVENTION

The present invention relates to current sensors and, more particularly, to a novel current sensor utilizing an isolated Hall-effect device in a closed feedback loop to provide an accurate ratioed measurement of current flowing in an adjacent conductor.

In electrical circuits, the most desirable variable for measurement and control is often the current flowing in a power circuit. It is well known that measurement of a current by causing that current to flow through a resistance, and then measuring the resulting voltage will not allow isolation of the measurement circuit from the power circuit. Typically, a current transformer is utilized to provide the isolation, although a current transformer having a high current ratio will require a large number of secondary winding turns. While normally undesirable, the use of current transformers is even more undesirable when it is necessary to measure several large currents simultaneously, as in the measurement of phase currents in a multi-phase (e.g. a three-phase) induction motor circuit, so that the three measured phase currents can be manipulated in an overload relay circuit to obtain proper motor protection.

PRIOR ART

The earliest current sensor was a resistor in a power circuit, with the resulting generated voltage (equal to the product of the instantaneous current and the resistance) being measured; not only is there no isolation, but excessive power dissipation will occur in the measurement resistance, if a measured current of over a few amperes is encountered.

It is relatively well known to measure the current $I_p$ flowing through a conductor 1 (see FIG. 1), from a first conductor end 1a to a second conductor end 1b, by use of a current transformer 2. The relatively expensive current transformer includes a toroidal core 3 of a magnetic material in which flows a first flux $\Phi_p$ in a first direction responsive to the primary conductor current $I_p$ flow, and a second flux $\Phi_s$ flowing in the opposite direction, responsive to the flow of a second current $I_s$ in a secondary winding 4. The second current $I_s$ is a variable current caused to flow into one secondary winding end 4a and to flow from the other secondary winding end 4b from a variable current source (not shown). A Hall-effect element 5 is positioned within an air gap 3a of the core, and provides a voltage between a pair of opposed electrodes 5a and 5b thereon, responsive to the magnitude of the total magnetic flux $\Phi$ passing perpendicularly through the element. A sensitive voltmeter 6 is connected between Hall-effect sensor electrodes 5a and 5b, so that the secondary current $I_s$ can be varied to null out (i.e. to reduce to zero) the net sum of the opposed primary and secondary current-induced fluxes $\Phi_p$ and $\Phi_s$; the primary current $I_p$ is then equal to the product of the secondary current $I_s$ and the ratio of the number of secondary winding turns $N_s$ to the number of primary winding turns $N_p$. Since the primary winding is a single turn, the primary current is then $I_p = N_s \cdot I_s$. It will be seen that measurement of a large primary conductor current $I_p$, with the use of a small precision current $I_s$, can require that the secondary winding 4 have a large number of turns $N_s$, further increasing the size of the core, and the total current transformer cost.

It is thus highly desirable to provide a flux-nulling current sensor, utilizing a Hall-effect device, which is not only less expensive than the ferrite-core current transformer, but also is smaller in size; is capable of giving an accurate measurement of the main conductor current; is capable of overcoming the well known non-linearity and temperature sensitivity of magnetic field-sensing Hall-effects devices; and does not require the usual extensive linearity and temperature correction circuitry normally associated with a current transformer.

BRIEF SUMMARY OF THE INVENTION

In accordance with the invention, a current sensor for use with a conductor with known cross-sectional characteristics, and having a first major surface, and an insulative means having a first surface adjacent to the conductor major surface, and another surface, comprises: an electronic circuit having a monolithic Hall-effect element disposed substantially perpendicular to the conductor first major surface; a conductive loop substantially encircling the element and oriented such that its flux is substantially orthogonal to the element surface; and an amplifier means for setting current flow in the said loop responsive to minimization of the differential Hall voltage across the element. The loop current, at null, is related to the conductor current by the ratio of the conductor flux path length to the loop length.

In a presently preferred embodiment, a current sensor utilizing a Hall effect device with current feedback, has a slab-like silicon Hall-effect device integrated into a monolithic substrate containing the feedback current loop and the differential amplifier. A bias current and generator can be used to calibrate the sensor before placement adjacent to the conductor in which current flow is to be measured.

Accordingly, it is an object of the present invention to provide a novel current sensor utilizing a semiconductive Hall-effect device in a current feedback arrangement.

This and other objects of the present invention will become apparent to those skilled in the art upon reading the following detailed description of a presently preferred embodiment, when considered in conjunction with the drawings.

DETAILED DESCRIPTION OF THE INVENTION

Figure 1:
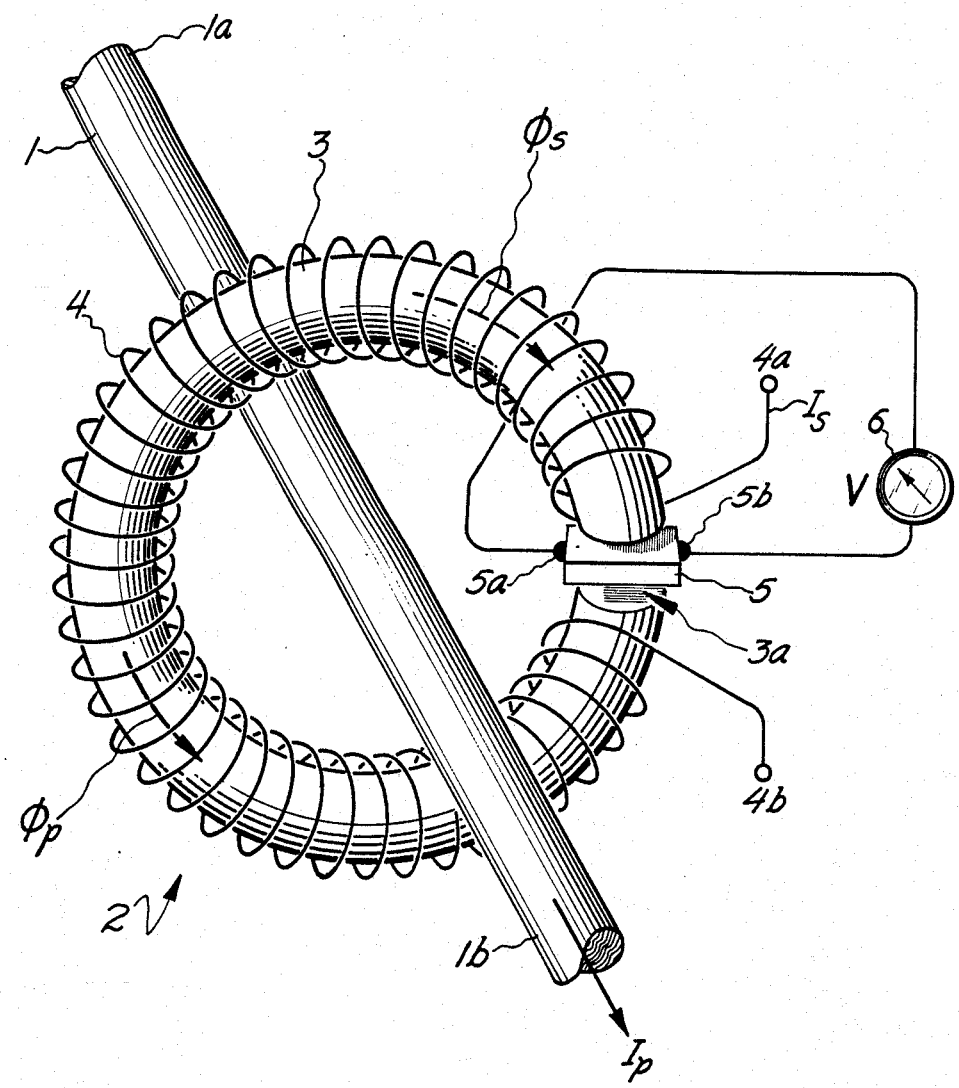
FIG. 1 is a perspective view of a prior art current transformer.
Figure 2:
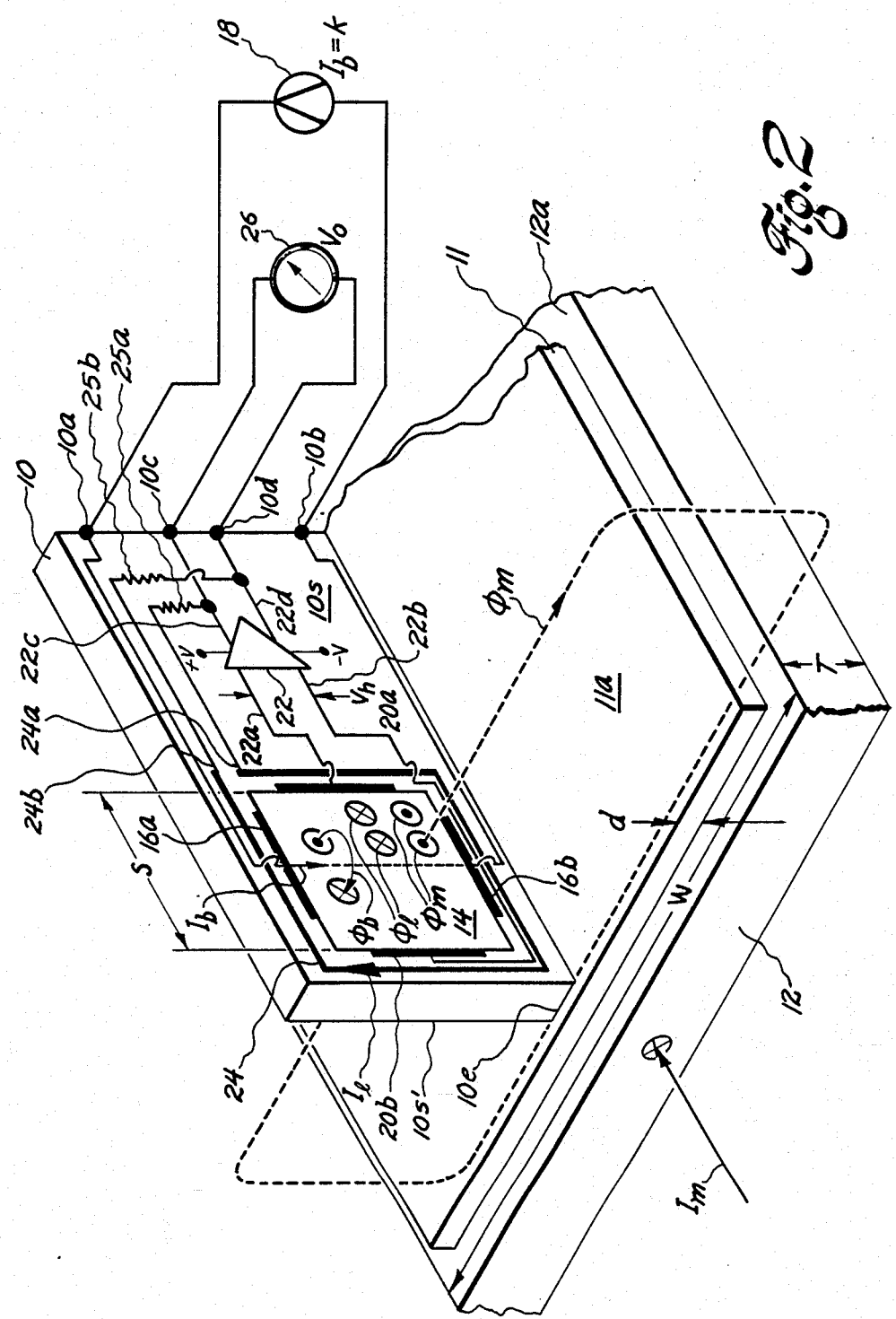
FIG. 2 perspective view of a presently preferred embodiment of the current sensor of the present invention.

Referring now to FIG. 2, a presently preferred embodiment of a current sensor 10 is a single silicon monolithic integrated circuit, which has an edge 10e mountable upon an outwardly-facing surface 11a of an insulative layer 11 positioned upon a major surface 12a of a primary conductor 12, through which primary conductor a main, or primary, current $I_m$ flows. Conductor 12 has substantially rectangular cross-section, having a width W and a thickness T. As illustrated, the current $I_m$ flows rightwardly into conductor 12 from the left, generating a main magnetic flux $\Phi_m$ flow beyond the periphery of the conductor. The density of main flux $\Phi_m$ close to the conductor varies relatively linearly with distance from the major surface 12a. This flux $\Phi_m$ flows through a Hall-effect device 14, fabricated as a portion of the silicon substrate of integrated circuit current sensor 10. The slab-like Hall-effect device 14 can, as illustrated, be of substantially square shape, with a side dimension S on the order of 5 milli-inches. By forming the Hall-effect device on the surface, or slightly into the thickness, of the monolithic semiconductor member 10, the resulting chip can be so packaged as to be used standing upon its side 10e, such that the main flux $\Phi_m$ is substantially perpendicular to the surface of device 14 as the flux enters through a first major chip surface (here, the back surface 10s' of the chip, furthest from the viewer) and exits from the opposite monolithic member major surface (here, the viewable major surface 10s); the flux moving towards the viewer is indicated by a large dot, symbolizing an arrow head, within a circle, while movement away from the viewer is indicated by a X, within a circle, indicating the tail of an arrow moving away from the viewer.

The slab-like Hall effect device 14 has a first pair of opposed electrodes 16a and 16b, on vertically opposite sides thereof with respect to the major surface 12a of the main conductor 12 with which the sensor is to be used. The electrodes 16a and 16b are respectively connected to monolithic circuit first and second terminals 10a and 10b; a bias current source 18, which may be either internal or external to monolithic integrated circuit 10, is connected between terminals 10a and 10b. A substantially constant bias current $I_b$, from source 18, is caused to flow through the Hall-effect device 14 in a direction substantially perpendicular to main flux $\Phi_m$, which is substantially perpendicular to the Hall-effect device surface. The passage of bias current $I_b$, here substantially downward toward the nearest main conductor major surface 12a, generates a bias flux $\Phi_b$, here illustrated as emerging from the righthand portions of the Hall-effect device and entering the lefthand portions of that device.

A second pair of opposed electrodes 20a and 20b are fabricated upon the remaining opposed pair of edges, here the vertically-disposed edges of the Hall-effect device 14, such that electrodes 20 are substantially perpendicular to electrodes 16, and to the main conductor flux $\Phi_m$ path through the device 14. A Hall-effect voltage $V_h$ is generated between electrodes 20a and 20b, responsive to the net magnitude of the total magnetic flux passing through the device 14. This device output voltage $V_h$ is applied between the differential inputs 22a and 22b of a high-gain differential amplifier means 22, preferably fabricated internal to monolithic sensor 10. Thus, first Hall electrode 20a is connected to first differential input 22a and second Hall electrode 20b is connected to second differential input 22b. The differential amplifier outputs 22c and 22d are returned to the vicinity of Hall-effect device 14, and are connected respectively to the first and second ends 24a and 24b of a current loop conductor means 24. Conductor 24 may be any current-carrying formation placed in close proximity to the periphery of the Hall-effect device 14. In the presently preferred embodiment, loop 24 is a pattern of a conductive metal deposited upon the chip surface 10s, and having a periphery only slightly greater than the Hall effect device periphery, e.g. a loop periphery of about 20 milli-inches. The differential amplifier outputs 22c and 22d are also connected to other terminals 10c and 10d, so that appropriate voltmeter means 26 may be utilized to measure the differential output voltage $V_o$; preferably, one of resistors 25a or 25b is in series between a loop end 24a or 24b and the associated amplifier output 22c or 22d, to ease measurement of the output voltage. Responsive to the differential amplifier output, a loop current $I_l$ is caused to flow in the loop 24, inducing an additional magnetic flux $\Phi_1$ within the device 14; if the amplifier gain is sufficiently high, the loop flux not only passes through the Hall-effect device in the opposite direction of the main flux $\Phi_m$ but also has a magnitude sufficient to cause the total Hall-effect device flux to tend towards a net flux null and, therefore, toward a null in the Hall voltage, i.e. $V_h = f(\Phi_m \pm \Phi_b - \Phi_1)$ and $V_h \rightarrow 0$ as m $(\Phi_1 \pm \Phi_b) \rightarrow \Phi_m$. The bias flux $\Phi_b$ is a calibration bias, set to cause $V_h = 0$ when $\Phi_m = \Phi_1$, for some selected $\Phi_m$ value.

In accordance with the invention, therefore, a small Hall-effect device 14 is surrounded by a current-carrying loop 24 which is fed by a high-gain amplifier 22 connected to the output of the Hall-effect device in such manner that the net magnetic flux through the Hall-effect device is essentially nulled. If the amplifier bandwidth is sufficiently large, and the amplifier is fed by a double-ended operating voltage (e.g. amplifier 22 receives operating voltages +V and −V) then A.C. current $I_m$ can be measured. A D.C. current $I_m$ can also be measured, although the D.C. offsets of the integrated circuit components must be more carefully controlled; it will be understood that proper control of D.C. effects will be easier to achieve in the preferred monolithic integrated circuit form, wherein the various controlled components are all very close and are at substantially the same temperature and the environmental factors, relative; to the controllable factors in a discrete circuit form.

This sensor has an inherent current ratio ($I_m/I_l$) which can be very large, due to the extremely short air path of the nulling coil 24 flux $\Phi_1$, relative to the air path of the main flux $\Phi_m$ around the perimeter of the main current-carrying conductor 12. It will be seen that, since only a flux null at the location of the relatively small Hall-effect device 14 is required, there is little pertibation of the flux in the entire system. If the air flux path of loop 24 has a periphery of about 0.020 inches, and the main flux $\Phi_m$ path is about 2.0 inches, a main current to loop current ratio $I_m/I_l$ of 100:1 is readily establishable, with simple geometries of loop 24 and conductor 12. It will now be seen that other geometries, such as a U-shaped current-carrying conductor, with the Hall-effect device located between the open ends of the U arms, may be utilized to extend the ratio range. However, use of a flat conductor 12 is presently desirable, as the variation of flux density close, but perpendicular, to the conductor is less than the (1/r) variation for circular conductors and therefore is less affected by small dimensional variations. Therefore, for A.C. measurements, the feedback sensor can be installed much like the prior art current transformer, and provides an intrinsically calibrated sensor, once the bias current $I_b$ is factory preset, as by immersing the sensor 10 in a flux $\Phi_m$ of the expected magnitude, setting the loop current for the desired loop current for the selected ratio, and adjusting the bias current source for null of voltage $V_h$. The calibrated sensor 10 is then easily utilizable by placing the proper sensor edge 10e, appropriately marked, against the main conductor insulation. It will also be understood that the insulative member 11 can be specifically formed at the desired sensor edge 10e, to allow fastening of the sensor with its insulator-carrying edge in abutment to the major surface of conductor 12; the integral insulative portion of the sensor then maintaining the sensor with a known displacement distance d from conductor major surface 12a.

While the several presently preferred embodiments of my novel method have been present herein by way of explanation, many variations and modifications will now become apparent to those skilled in the art. For example, a multiple element Hall-effect device (instead of the single element device shown) can be used to cancel stress, temperature and the like effects. It is my intent, therefore, to be limited only by the scope of the appended claims.

What I claim is:

1. A current sensor for measurement, by the amplitude and direction of a signal to a meter external to the sensor, of a current $I_m$ flowing in a conductor external to the sensor, comprising:
    a Hall-effect element having a surface disposable substantially perpendicular to a magnetic flux $\Phi_m$ responsive to said current $I_m$, said element having first electrode means for providing a voltage $V_h$ having a magnitude responsive to the net magnetic flux passing through said surface;
    a single conductive loop substantially encircling the element and oriented to cause a magnetic loop flux $\Phi_m$ therefrom, responsive to a current $I_1$ in said loop, to be substantially perpendicular to the element surface, said current $I_1$ being proportional to, but different from, said current $I_m$; and
    means, responsive to said element voltage $V_h$, for establishing said loop current $I_1$ to generate said loop flux $\Phi_1$ with magnitude and polarity to cancel said flux $\Phi_m$ in said element, said establishing means providing said signal to said external meter proportional to the loop current.

2. The sensor of claim 1, wherein said establishing means comprises a differential amplifier having differential inputs receiving the element voltage $V_h$ therebetween, and a pair of differential outputs, each connected to a different end of the loop, with said signal appearing therebetween.

3. The sensor of claim 2, wherein the element, loop and differential amplifier are all integrated into a single monolithic structure.

4. The sensor of claim 3, wherein the monolithic integrated structure is fabricated on a substrate of silicon.

5. The sensor of claim 4, wherein the conductive loop is fabricated upon a major surface of said substrate and is exteriorly adjacent to the periphery of said element.

6. The sensor of claim 5, wherein said element comprises a slab-like portion of said substrate and has a substantially square shape on said substrate major surface.

7. The sensor of claim 1, further comprising means for providing a bias flux $\Phi_b$ to pass through said element.

8. The sensor of claim 7, wherein said providing means includes second electrode means for contacting a pair of opposed peripheral portions of the element; and means for causing a substantially constant bias current $I_b$ to flow through said element between second electrode means.

9. The sensor of claim 8, wherein said bias current is fixedly set to cause said element voltage $V_h$ to be nulled with equal and opposite magnitudes of the loop flux $\Phi_1$ and the main flux $\Phi_m$ passing through the element.

10. The sensor of claim 1, wherein the conductive loop is exteriorly adjacent to, and with substantially the same shape as, the periphery of said element.

11. The sensor of claim 2, further comprising a pair of resistance elements, each in series between each amplifier output and the associated loop end.

12. The sensor of claim 11, wherein the resistance elements are of substantially equal resistance magnitudes.

13. The sensor of claim 1, in combination with: the conductor; and means for locating the sensor adjacent to the conductor and with orientation to cause the main magnetic flux $\Phi_m$ to pass substantially perpendicularly through the element surface.

14. The combination of claim 13, wherein the locating means also spaces the element and the conductor by a distance selected to cause a preselected magnetic flux $\Phi_m$ value to be present through the element surface responsive to a preselected value of said main current $I_m$.

15. The combination of claim 13, further comprising means for measuring the differential output signal.

* * * * *